United States Patent
Chou et al.

(10) Patent No.: US 9,293,392 B2
(45) Date of Patent: Mar. 22, 2016

(54) 3DIC INTERCONNECT APPARATUS AND METHOD

(71) Applicant: Taiwan Semiconductor Manufacturing Company, Ltd., Hsin-Chu (TW)

(72) Inventors: Shih Pei Chou, Tainan (TW);
Hung-Wen Hsu, Tainan (TW);
Ching-Chung Su, Yongkang (TW);
Chun-Han Tsao, New Taipei (TW); Lin Chia-Chieh, Kaohsiung (TW);
Shu-Ting Tsai, Kaohsiung (TW);
Jiech-Fun Lu, Madou Township (TW);
Shih-Chang Liu, Alian Township (TW);
Yeur-Luen Tu, Taichung (TW);
Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/020,370

(22) Filed: Sep. 6, 2013

(65) Prior Publication Data

US 2015/0069619 A1    Mar. 12, 2015

(51) Int. Cl.
*H01L 23/48*    (2006.01)
*H01L 25/065*    (2006.01)
*H01L 25/00*    (2006.01)
*H01L 21/683*    (2006.01)
*H01L 25/16*    (2006.01)

(52) U.S. Cl.
CPC .......... *H01L 23/481* (2013.01); *H01L 25/0657* (2013.01); *H01L 21/6835* (2013.01); *H01L 21/6836* (2013.01); *H01L 25/16* (2013.01); *H01L 25/50* (2013.01); *H01L 2225/06544* (2013.01); *H01L 2924/0002* (2013.01); *H01L 2924/10253* (2013.01)

(58) Field of Classification Search
CPC ... H01L 23/481; H01L 25/50; H01L 25/0657; H01L 21/6835; H01L 21/6836; H01L 21/76898; H01L 25/16; H01L 27/14618; H01L 24/16
USPC .................. 438/107, 667, 637–640, 406, 455; 257/773, 774, 686, 758, 777
See application file for complete search history.

(56) References Cited

U.S. PATENT DOCUMENTS

| | | | | |
|---|---|---|---|---|
| 6,650,010 | B2 * | 11/2003 | Davis et al. | 257/700 |
| 8,859,390 | B2 * | 10/2014 | Farooq et al. | 438/455 |
| 2002/0074670 | A1 * | 6/2002 | Suga | 257/777 |
| 2011/0193197 | A1 * | 8/2011 | Farooq et al. | 257/618 |

* cited by examiner

*Primary Examiner* — Thinh T Nguyen
(74) *Attorney, Agent, or Firm* — Slater & Matsil, L.L.P.

(57) ABSTRACT

An interconnect apparatus and a method of forming the interconnect apparatus is provided. Two substrates, such as wafers, dies, or a wafer and a die, are bonded together. A first mask is used to form a first opening extending partially to an interconnect formed on the first wafer. A dielectric liner is formed, and then another etch process is performed using the same mask. The etch process continues to expose interconnects formed on the first substrate and the second substrate. The opening is filled with a conductive material to form a conductive plug.

20 Claims, 8 Drawing Sheets

3DIC INTERCONNECT APPARATUS AND METHOD

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely, a method for forming interconnect structures for a stacked semiconductor device. Other embodiments, however, may be applied to a variety of semiconductor devices. Hereinafter, various embodiments will be explained in detail with reference to the accompanying drawings.

Figure 1:
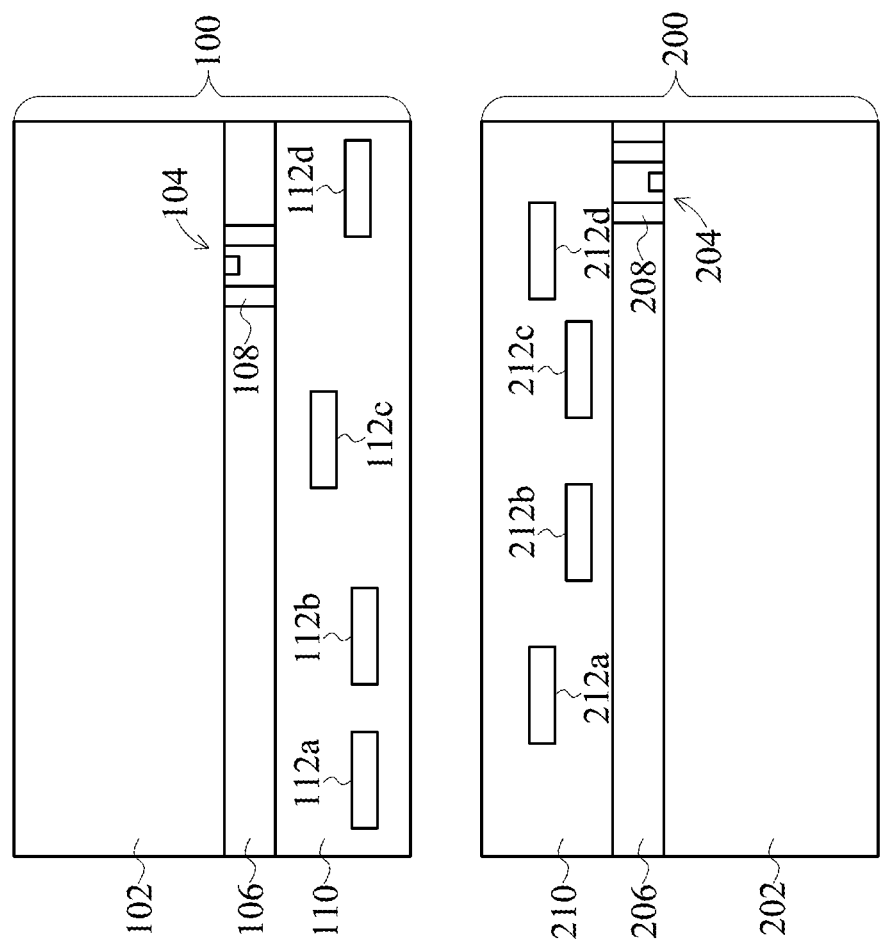
FIGS. 1-7 are cross-sectional views of various processing steps during fabrication of an interconnect in accordance with an embodiment.

Referring first to FIG. 1, a first wafer 100 and a second wafer 200 is shown prior to a bonding process in accordance with various embodiments. In an embodiment, the second wafer 200 has similar features as the first wafer 100, and for the purpose of the following discussion, the features of the second wafer 200 having reference numerals of the form "2xx" are similar to features of the first wafer 100 having reference numerals of the form "1xx," the "xx" being the same numerals for the first substrate 102 and the second substrate 202. The various elements of the first wafer 100 and the second wafer 200 will be referred to as the "first <element> 1xx" and the "second <element> 2xx," respectively.

In an embodiment, the first wafer 100 comprises a first substrate 102 having a first electrical circuit (illustrated collectively by first electrical circuitry 104) formed thereon. The first substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The first electrical circuitry 104 formed on the first substrate 102 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the first electrical circuitry 104 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 is a first inter-layer dielectric (ILD) layer 106. The first ILD layer 106 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the first ILD layer 106 may comprise a plurality of dielectric layers.

First contacts 108 are formed through the first ILD layer 106 to provide an electrical contact to the first electrical circuitry 104. The first contacts 108 may be formed, for example, by using photolithography techniques to deposit and pattern a photoresist material on the first ILD layer 106 to expose portions of the first ILD layer 106 that are to become the first contacts 108. An etch process, such as an anisotropic dry etch process, may be used to create openings in the first ILD layer 106. The openings may be lined with a diffusion barrier layer and/or an adhesion layer (not shown), and filled with a conductive material. The diffusion barrier layer comprises one or more layers of TaN, Ta, TiN, Ti, CoW, or the like, and the conductive material comprises copper, tungsten, aluminum, silver, and combinations thereof, or the like, thereby forming the first contacts 108 as illustrated in FIG. 1.

One or more first inter-metal dielectric (IMD) layers 110 and the first interconnect lines 112a-112d (collectively referred to as first interconnect lines 112) in metallization layers are formed over the first ILD layer 106. Generally, the one or more first IMD layers 110 and the associated metallization layers are used to interconnect the electrical circuitry to each other and to provide an external electrical connection. The first IMD layers 110 may be formed of a low-K dielectric material, such as fluorosilicate glass (FSG) formed by PECVD techniques or high-density plasma chemical vapor deposition (HDPCVD) or the like, and may include intermediate etch stop layers. External contacts (not shown) may be formed in an uppermost layer.

It should also be noted that one or more etch stop layers (not shown) may be positioned between adjacent ones of the dielectric layers, e.g., the first ILD layer 106 and the first IMD layers 110. Generally, the etch stop layers provide a mechanism to stop an etching process when forming vias and/or contacts. The etch stop layers are preferably formed of a dielectric material having a different etch selectivity from adjacent layers, e.g., the underlying first substrate 102, the overlying first ILD layer 106, and the overlying first IMD layers 110. In an embodiment, etch stop layers may be formed of SiN, SiCN, SiCO, CN, combinations thereof, or the like, deposited by CVD or PECVD techniques.

In an embodiment, the first wafer 100 is a backside illumination sensor (BIS) and the second wafer 200 is a logic circuit, such as an ASIC device. In this embodiment, the electrical circuitry 104 includes photo active regions, such as photo-diodes formed by implanting impurity ions into the epitaxial layer. Furthermore, the photo active regions may be a PN junction photo-diode, a PNP photo-transistor, an NPN photo-transistor or the like. The BIS sensor may be formed in an epitaxial layer over a silicon substrate.

The second wafer 200 may comprise a logic circuit, an analog-to-digital converter, a data processing circuit, a memory circuit, a bias circuit, a reference circuit, and the like.

In an embodiment, the first wafer 100 and the second wafer 200 are arranged with the device sides of the first substrate 102 and the second substrate 202 facing each other as illustrated in FIG. 1. As discussed in greater detail below, an opening will be formed extending from a backside (opposite the device side) of the first wafer 100 to the selected portions of the second interconnect lines 212 of the second wafer 200, such that portions of the first interconnect lines 112 of the first wafer 100 will also be exposed. The opening will be subsequently filled with a conductive material, thereby forming an electrical contact on the backside of the first wafer to the interconnect lines of the first wafer 100 and the second wafer 200.

Figure 2:
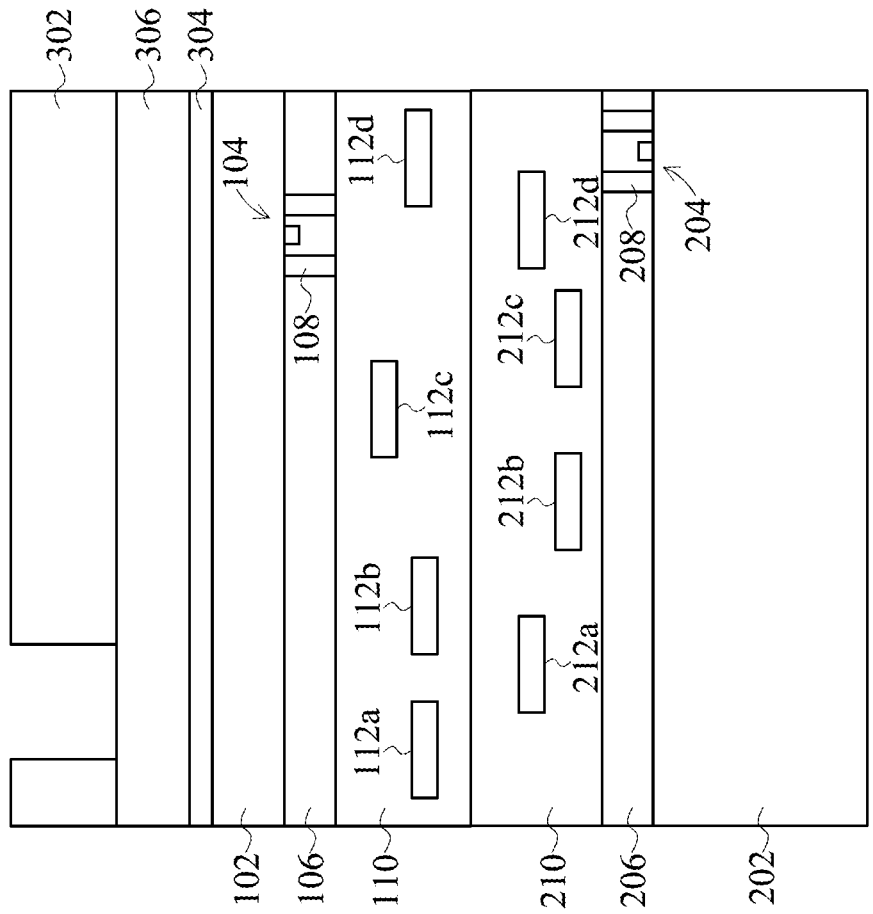

FIG. 2 illustrates the first wafer 100 and the second wafer 200 after bonding and after a patterned mask 302 has been formed thereon in accordance with an embodiment. As shown in FIG. 1, the first wafer 100 will be stacked and bonded on top of the second wafer 200. The first wafer 100 and the second wafer 200 may be bonded using, for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof and/or the like.

It should be noted that the bonding may be at wafer level, wherein the first wafer 100 and the second wafer 200 are bonded together, and are then singulated into separated dies. Alternatively, the bonding may be performed at the die-to-die level, or the die-to-wafer level.

After the first wafer 100 and the second wafer 200 are bonded, a thinning process may be applied to the backside of the first wafer 100. In an embodiment in which the first substrate 102 is a BIS sensor, the thinning process serves to allow more light to pass through from the backside of the first substrate to the photo-active regions without being absorbed by the substrate. In an embodiment in which the BIS sensor is fabricated in an epitaxial layer, the backside of the first wafer 100 is thinned until the epitaxial layer is exposed. The thinning process may be implemented by using suitable techniques such as grinding, polishing, a SMARTCUT® procedure, an ELTRAN® procedure, and/or chemical etching.

In an embodiment, the patterned mask 302 is a photoresist mask that has been masked, exposed, and developed as part of a photolithography process. Generally, a photoresist material is irradiated (exposed) and developed to remove a portion of the photoresist material. The remaining photoresist material protects the underlying material from subsequent processing steps, such as etching. In FIG. 2, the patterned mask 302 is patterned to define a contact opening to be formed in subsequent processing steps.

Also shown in FIG. 2 is an optional anti-reflection coating (ARC) layer 304 and one or more optional hard mask layers (one hard mask layer 306 being shown). The ARC layer 304 reduces the reflection of the exposure light used during the photolithography process to pattern the patterned mask 302, which reflection may cause inaccuracies in the patterning. The ARC layer 304 may be formed of a nitride material (e.g., silicon nitride), an organic material (e.g., silicon carbide), an oxide material, high-k dielectric, and the like. The ARC layer 304 may be formed using suitable techniques such as CVD and/or the like.

In an embodiment, the hard mask layer 306 is a silicon oxynitride (SiON) layer. Generally, one or more hard mask layers may be useful in embodiments in which the etching process requires masking in addition to the masking provided by the patterned mask 302. During the subsequent etching process to pattern the first substrate 102 and the first ILD layer 106/IMD layers 110, the patterned mask 302 will also be etched, although the etch rate of the patterned mask 302 may not be as high as the etch rate of the first substrate 102 and the ILD layer 106/IMD layers 110. If the etch process is such that the patterned mask 302 would be consumed before the etching process is completed, then an additional hard mask may be utilized. The material of the hard mask layer or layers is selected such that the hard mask layer(s) exhibit a lower etch rate than the underlying materials, such as the materials of the first substrate 102 and the ILD layer 106/IMD layers 110. The hard mask layer 306 may have a thickness of about 1 μm to about 2 μm. Other hard mask materials may be used, such as one or more layers of silicon nitride, polysilicon, an oxide layer, other nitride layer, and/or the like. While a single hard mask layer 306 is illustrated, other embodiments may utilize a plurality of hard mask layers.

Figure 3:
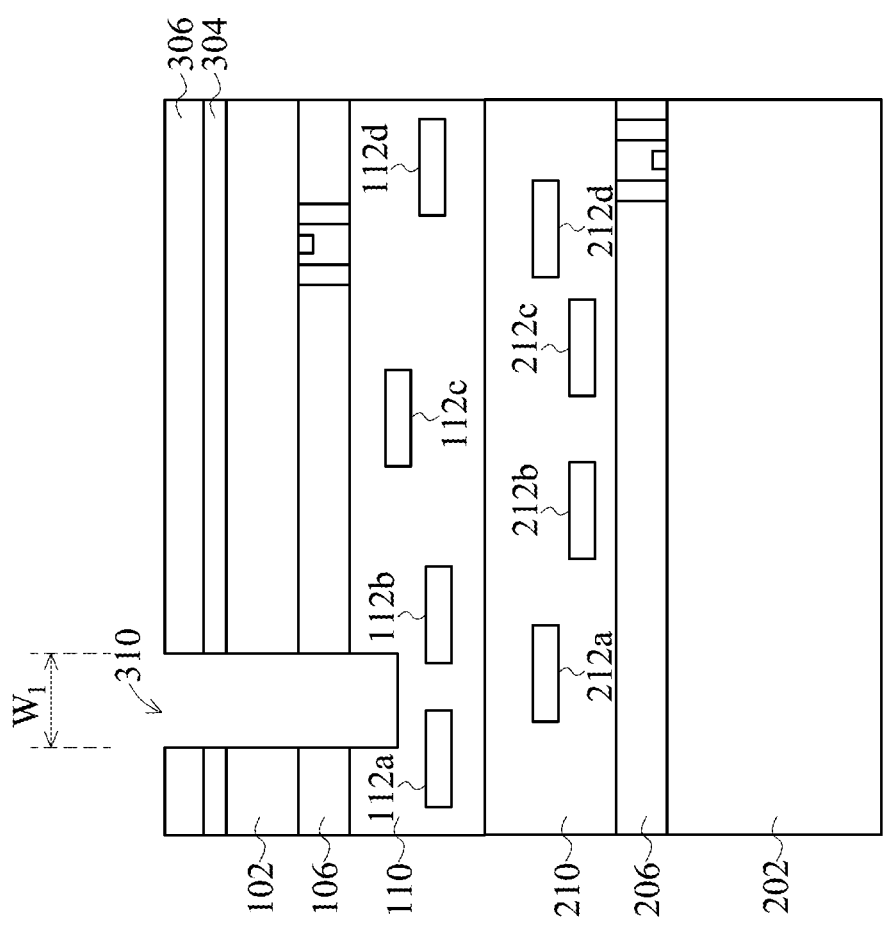

FIG. 3 illustrates the first wafer 100 and the second wafer 200 after a first etch process to form a first opening 310 in accordance with various embodiments. As illustrated in FIG. 3, the first opening 310 extends partially to the second wafer 202. As discussed in greater detail below, first interconnect lines 112a and 112b of the first wafer 100 will be electrically coupled to second interconnect line 212a of the second wafer 200. Generally, a first opening extending partially to the first interconnect lines 112a and 112b will be formed, and a second opening will be formed to and through the opening between the first interconnect lines 112a and 112b, and to the second interconnect line 212a of the second wafer 200, thereby forming an opening extending from the backside of the first wafer 100 to the second interconnect lines 212a.

Accordingly, the first opening 310 extends from a surface of the first wafer 100 (e.g., a backside surface of the first wafer 100 in this example) toward the first interconnect lines 112a and 112b of the first wafer 100. The first etch process may utilize one or more etching processes to etch through the various layers. For example, in an embodiment in which the hard mask layer 306 is formed of SiON, the hard mask layer 306 may be patterned using a plasma dry etch process with a fluorine-based etch gas.

After patterning the hard mask layer 306, the first substrate 102 and the first ILD layer 106/IMD layers 110 may be patterned to form the first opening 310. In an embodiment in which the first substrate 102 comprises silicon and the first ILD layer 106/IMD layers 110 comprises one or more layers of silicon oxide, the first substrate 102 may be etched using, for example, $HBr/O_2$, $HBr/Cl_2/O_2$, or $SF_6/Cl_2$ plasma, and the ILD layer 106/IMD layers 110 may be patterned using an anisotropic dry etch process using an etchant having a high etch selectivity between the substrate 102 and the first ILD layer 106/IMD layers 110, such as $C_4F_8$ or $C_5F_8$. In an embodiment, the etch process to form the first opening is a timed etch process in which the time the etch process is performed is selected such that the desired depth is achieved.

In embodiments, etch stop layers may be formed between the various first ILD layer 106/IMD layers 110. In these embodiments, multiple etch processes may be utilized to provide sufficient etch selectivity between the types of materials of the various layers.

After the first opening 310 has been formed, the remaining photoresist layer (e.g., patterned mask 302, see FIG. 2), if any, may be removed by using suitable photoresist stripping techniques such as chemical solvent cleaning, plasma ashing, dry stripping and/or the like.

In an embodiment, the first opening 310 has a width W1 of from about 0.5 µmm to about 3 µmm such as about 1.3 µmm. Widths such as these allow smaller dimensions and a higher density of interconnects than other systems that utilize one size of opening extending through the semiconductor wafer and another size of opening extending through the dielectric layers. Furthermore, embodiments such as those discussed herein allow for use of a single mask to form the contact plug, whereas other systems use a plurality of masks.

Figure 4:
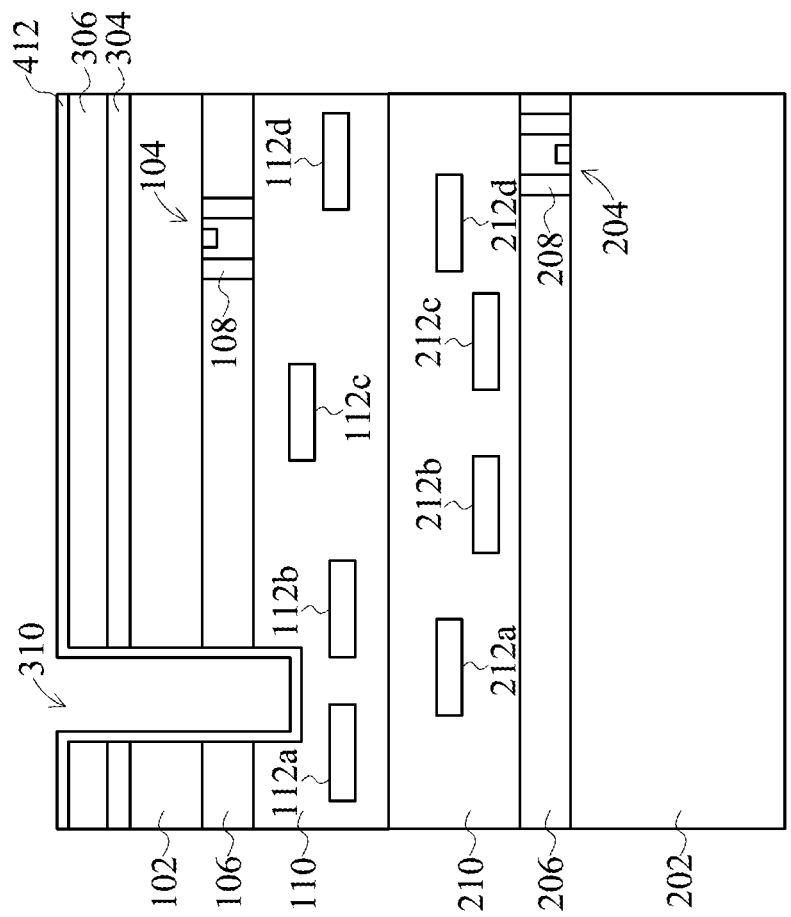

FIG. 4 illustrates the first wafer 100 and the second wafer 200 after a dielectric isolation layer 412 is formed in the first opening 310 in accordance with an embodiment. As shown in FIG. 4, the dielectric isolation layer 412 is formed over the bottoms and sidewalls of the first opening 310. Furthermore, the dielectric isolation layer 412 may extend over the top surface of the semiconductor device as shown in FIG. 4.

The dielectric isolation layer 412 may be formed of various dielectric materials. In an embodiment, the dielectric isolation layer 412 is formed of silicon nitride. Alternatively, dielectric isolation layer 412 is a layer of silicon dioxide, a doped glass layer such as boron silicate glass and the like, a silicon oxynitride layer, a polyamide layer, a low dielectric constant insulator or the like. In addition, a combination of the foregoing dielectric materials may also be used to form the dielectric isolation layer 412. In accordance with some embodiments, the dielectric isolation layer 412 may be formed using suitable techniques such as sputtering, oxidation, CVD, and/or the like to a thickness of about 0.5 µm to about 1 µm.

Figure 5:
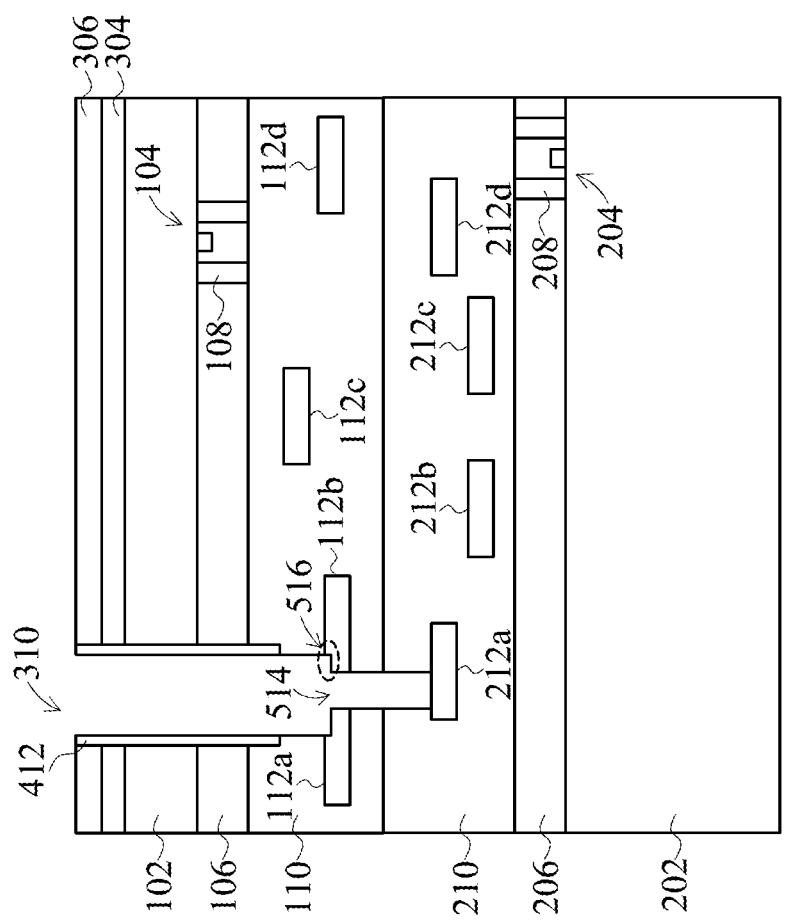

FIG. 5 illustrates the semiconductor device shown in FIG. 4 after one or more additional etching processes are performed in accordance with various embodiments. A suitable etching process, such as a dry etch, an anisotropic wet etch, or any other suitable anisotropic etch or patterning process, may be performed on the semiconductor device to form a second opening 514.

As illustrated in FIG. 5, the second opening 514 extends the first opening 310 to the first interconnect lines 112a and 112b. In an embodiment, the first interconnect lines 112a and 112b are formed of suitable metal materials such as copper, which exhibits a different etching rate (selectivity) than the first IMD layers 110. As such, the first interconnect lines 112a and 112b may function as a hard mask layer for the etching process of the first IMD layers 110. A selective etching process may be employed to etch the first IMD layers 110 rapidly while etching only a portion of the first interconnect lines 112a and 112b. As shown in FIG. 5, the exposed portion of the first interconnect lines 112a and 112b may be partially etched away, thereby forming a recess 516. The depth of the recess 516 may vary depending on a variety of applications and design needs.

The second etch process continues until the second interconnect line 212a is exposed, thereby forming a combined opening extending from a backside of the first wafer 100 to the second interconnect line 212a of the second wafer 200 as illustrated in FIG. 5.

Figure 6:
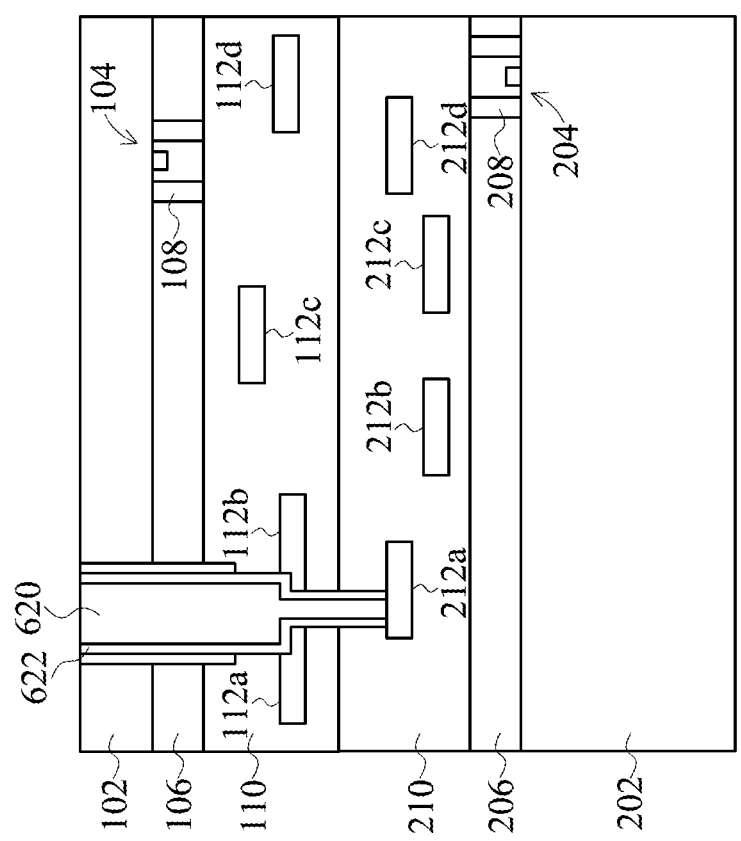

FIG. 6 illustrates a conductive material formed within the first opening 310 and the second opening 514 in accordance with various embodiments. In an embodiment, the conductive material may be formed by depositing one or more diffusion and/or barrier layers 622 and depositing a seed layer. For example, a diffusion barrier layer comprising one or more layers of Ta, TaN, TiN, Ti, CoW, or the like is formed along the sidewalls of the first opening 310 and the second opening 514. The seed layer (not shown) may be formed of copper, nickel, gold, any combination thereof and/or the like. The diffusion barrier layer and the seed layer may be formed by suitable deposition techniques such as PVD, CVD and/or the like. Once the seed layer has been deposited in the openings, a conductive material, such as tungsten, titanium, aluminum, copper, any combinations thereof and/or the like, is filled into the first opening 310 and the second opening 514, using, for example, an electro-chemical plating process, thereby forming a conductive plug 620.

FIG. 6 also illustrates removal of excess materials from the hard mask layer 306, ARC 304 and a conductive plug 620 after filling the first opening 310 and the second opening 514 with a conductive material. Excess materials may be removed using a planarization process, such as a chemical-mechanical polishing (CMP) process, etch back step and the like.

Figure 7:
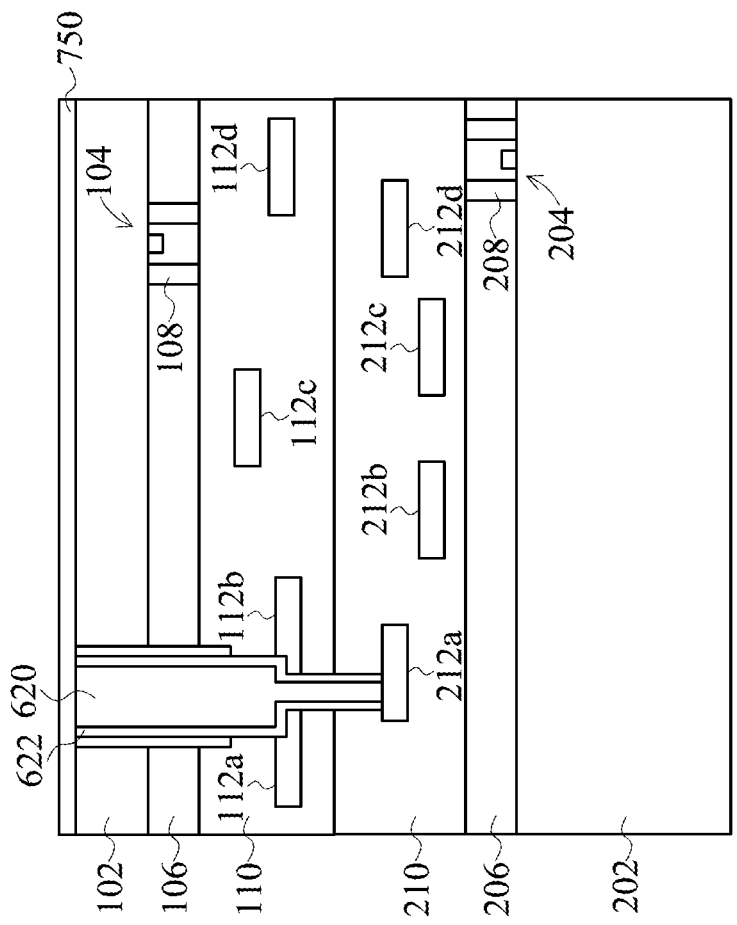

FIG. 7 illustrates a dielectric capping layer 750 formed along a backside of the first wafer 100. The dielectric capping layer 750 may comprise commonly used dielectric materials, such as silicon nitride, silicon oxynitride, silicon oxycarbide, silicon carbide, combinations thereof, and multi-layers thereof. The dielectric capping layer 750 may be deposited over the semiconductor device through suitable deposition techniques such as sputtering, CVD and the like.

A stacked wafer having the conductive plug as discussed above allows active circuits of both semiconductor wafers to be electrically coupled through a single conductive plug (e.g., conductive plug 620). Such a single conductive plug helps to further reduce form factor. Furthermore, in comparison to stacked semiconductor devices connected by multiple conductive plugs, the single conductive plug coupled between two semiconductor wafers shown in FIG. 7 helps to cut power consumption and prevent parasitic interference.

It should be noted while FIG. 7 illustrates two semiconductor wafers stacked together, one skilled in the art will recognize that the stacked semiconductor device shown in FIG. 7 is merely an example. There may be many alternatives, variations and modifications. For example, the stacked semiconductor device may accommodate more than two semiconductor wafers.

Figure 8:
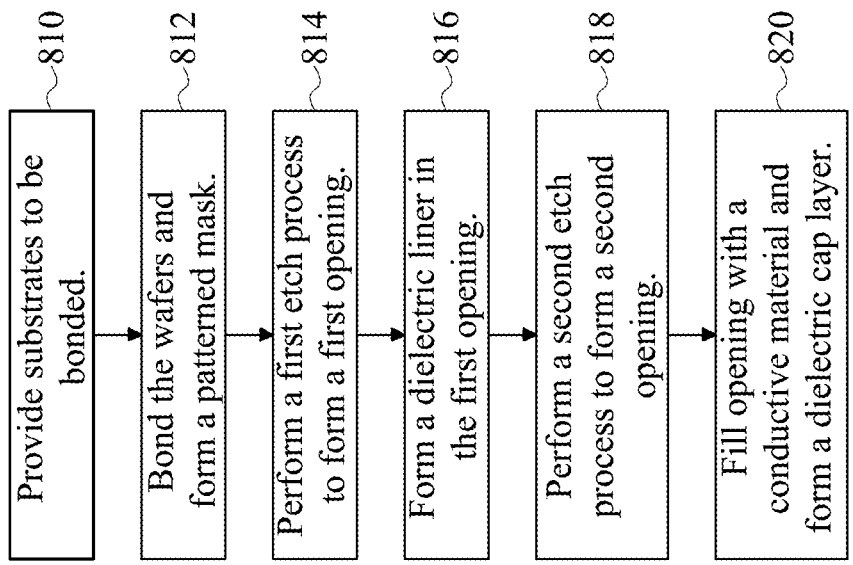
FIG. 8 is a flow diagram illustrating a method of forming an interconnect in accordance with an embodiment.

FIG. 8 is a flowchart illustrating a method of forming stacked chip configuration in accordance with an embodiment. The method begins in step 810, wherein substrates to be bonded are provided. The substrates may be processed wafers (such as those illustrated in FIG. 1), dies, a wafer and a die, or the like. In step 812, the substrates are bonded and a patterned mask is formed thereon, the patterned mask defining an opening for a contact plug to be subsequently formed, such as that discussed above with reference to FIG. 2. Optionally, an ARC layer and/or one or more hard mask layers are formed.

Thereafter, in step 814, a first etch process is performed to etch through one wafer and partially into the overlying dielectric layers, such as discussed above with reference to FIG. 3, thereby forming a first opening. In step 816, a dielectric liner is formed within the first opening, and in step 818, a second etch process is performed, such as that discussed above with reference to FIGS. 4 and 5. The second opening extends the first opening through the bonding interface and to an interconnect line in the second substrate. Interconnect lines in the first substrate act as an etch mask. As a result, the combination of the first mask and the second mask form an opening extending from a backside of the first substrate, through the first substrate and into the second substrate.

The opening is filled with a conductive material in step 820, such as that discussed above with reference to FIG. 6. A dielectric cap layer may be formed over the conductive material, such as that discussed above with reference to FIG. 7.

In an embodiment, an apparatus is provided. The apparatus includes a first semiconductor chip that has a first substrate, a plurality of first inter-metal dielectric layers and a plurality of first metal lines formed in the first inter-metal dielectric layers over the first substrate. A first surface of the first semiconductor chip is bonded to a surface of a second semiconductor chip, wherein the second semiconductor chip has a second substrate, a plurality of second inter-metal dielectric layers and a plurality of second metal lines formed in the second inter-metal dielectric layers over the second substrate. A conductive plug extends from a second surface of the first semiconductor chip, through the first semiconductor chip, and to one of the plurality of second metal lines in the second semiconductor chip, the conductive plug having a continuous vertical sidewall from the second surface of the first semiconductor chip to one of the plurality of metal lines in the first semiconductor chip.

In another embodiment, a method is provided. The method includes bonding a first surface of a first semiconductor chip to a surface of a second semiconductor chip. A first opening is formed extending from a second surface of the first semiconductor chip partially to a conductive feature in the first semiconductor chip. A liner is formed in the first opening, and a second opening is formed extending from the bottom of the first opening to a conductive feature in the second semiconductor chip, the second opening exposing at least a portion of the conductive feature of the first semiconductor chip. The first opening and the second opening are filled with a conductive material.

In yet another embodiment, another method is provided. The method includes bonding a first substrate and a second substrate such that dielectric layers formed on each substrate face each other. The dielectric layers have conductive features formed therein. A first opening extending through the first substrate and partially through the dielectric layers on the first substrate is formed such that the first opening does not extend to a conductive interconnect on the first substrate. A second opening is formed that extend from a bottom of the first opening to a conductive interconnect on the second substrate, the second opening exposing a portion of a conductive interconnect on both the first and second substrates.

The first opening and the second opening are filled with a conductive material.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
bonding a first surface of a first semiconductor chip to a surface of a second semiconductor chip;
after the bonding, forming a first opening extending from a second surface of the first semiconductor chip partially to a conductive feature in the first semiconductor chip;
forming a liner in the first opening;
forming a second opening extending from a bottom of the first opening to a conductive feature in the second semiconductor chip, the second opening exposing at least a portion of a sidewall and an adjoining horizontal surface of the conductive feature of the first semiconductor chip; and
forming a conductive material in the first opening and the second opening.

2. The method of claim 1, wherein the forming the first opening comprises a timed etch process.

3. The method of claim 1, wherein the second opening extends between conductive features in the first semiconductor chip, and wherein the forming the second opening exposes the conductive features in the first semiconductor chip.

4. The method of claim 3, further comprising recessing the conductive features in the first semiconductor chip.

5. The method of claim 1, further comprising forming a dielectric cap layer over the conductive material.

6. The method of claim 1, wherein the forming the conductive material comprises forming the conductive material over the liner, the liner not extending to the conductive feature in the first semiconductor chip.

7. A method comprising:
   providing a first substrate, the first substrate having one or more overlying first dielectric layers and a first conductive interconnect in the one or more first dielectric layers;
   providing a second substrate, the second substrate having one or more overlying second dielectric layers and a second conductive interconnect in the one or more second dielectric layers;
   bonding the first substrate and the second substrate such that the first dielectric layers face the second dielectric layers;
   after the bonding, forming a first opening extending through the first substrate and partially through the first dielectric layers, the first opening not extending to the first conductive interconnect;
   forming a second opening extending from a bottom of the first opening to the second conductive interconnect, the second opening exposing a top portion of the first conductive interconnect and the second conductive interconnect; and
   forming a conductive plug in the first opening and the second opening.

8. The method of claim 7, wherein the first conductive interconnect acts as a mask during the forming the second opening.

9. The method of claim 7, wherein the forming the second opening forms a recess in the first conductive interconnect.

10. The method of claim 7, wherein the first opening has a width of 1.3 µm.

11. The method of claim 7, further comprising after the forming the first opening and before the forming the second opening, forming a dielectric liner in the first opening.

12. The method of claim 11, wherein the forming the conductive plug comprises forming a conductive material over the dielectric liner.

13. The method of claim 7, further comprising forming a dielectric cap layer over the conductive plug.

14. A method comprising:
   bonding a first surface of a first semiconductor chip to a surface of a second semiconductor chip, the first semiconductor chip having a first substrate and one or more overlying first dielectric layers and a first conductive interconnect in the one or more first dielectric layers, the second semiconductor chip having a second substrate and one or more overlying second dielectric layers and a second conductive interconnect in the one or more second dielectric layers, the first surface being a surface of the one or more overlying first dielectric layers;
   after the bonding forming a first opening extending from a second surface of the first semiconductor chip toward a first conductive feature in the first semiconductor chip, the first opening ending prior to the conductive feature;
   forming a first liner in the first opening;
   forming a second opening extending from a bottom of the first opening to a second conductive feature in the second semiconductor chip, the second opening exposing at least a portion of the first conductive feature in the first semiconductor chip; and
   forming a conductive material in the first opening and the second opening.

15. The method of claim 14, wherein the forming the first opening comprises a timed etch process.

16. The method of claim 14, wherein the forming the second opening comprises forming a recess in the first conductive feature.

17. The method of claim 14, wherein the second opening extends between conductive features in the first semiconductor chip, and wherein the forming the second opening exposes the conductive features in the first semiconductor chip.

18. The method of claim 17, further comprising recessing the conductive features in the first semiconductor chip.

19. The method of claim 14, further comprising forming a second liner over the first liner, the second liner directly contacting the one or more first dielectric layers.

20. The method of claim 14, wherein the forming the conductive material comprises forming the conductive material over the first liner, the first liner not extending to the conductive feature in the first semiconductor chip.

* * * * *